United States Patent [19]

Owensby et al.

[11] Patent Number: 4,786,757

[45] Date of Patent: Nov. 22, 1988

[54] FLEXIBLE ELECTROMAGNETIC PULSE SHIELDING CONDUIT

[75] Inventors: Max T. Owensby, Canoga Park; Richard J. Van Ness, Paso Robles; Richard J. Delahunty, Templeton, all of Calif.

[73] Assignee: 501 Fleetwood Electronics, Inc., Canoga Park, Calif.

[21] Appl. No.: 124,165

[22] Filed: Nov. 23, 1987

[51] Int. Cl.⁴ .................. H05K 9/00; H02G 3/04; F16L 33/20; F16L 39/00
[52] U.S. Cl. .................. 174/35 C; 174/68.3; 285/149; 361/215
[58] Field of Search .................. 174/35 C, 47, 68 C, 174/74 R, 89; 138/109; 285/149, 256; 361/215; 439/607, 610

[56] References Cited

U.S. PATENT DOCUMENTS

| | | | |
|---|---|---|---|
| 2,463,293 | 3/1949 | Mentel | 285/149 |
| 2,848,254 | 8/1958 | Millar | 285/149 |
| 4,025,145 | 5/1977 | Shaffer et al. | 439/610 |
| 4,275,769 | 6/1981 | Cooke | 138/109 |
| 4,693,323 | 9/1987 | Owensby | 174/35 C |

FOREIGN PATENT DOCUMENTS

| | | | |
|---|---|---|---|
| 715437 | 8/1965 | Canada | 285/149 |
| 734830 | 5/1966 | Canada | 285/149 |
| 1383579 | 11/1964 | France | 285/149 |
| 677656 | 8/1952 | United Kingdom | 285/149 |
| 859613 | 1/1961 | United Kingdom | 285/149 |
| 948435 | 2/1964 | United Kingdom | 138/109 |

Primary Examiner—Laramie E. Askin
Attorney, Agent, or Firm—Jack C. Munro

[57] ABSTRACT

A flexible electromagnetic pulse shielding conduit for electrical conductors which is constructed of a backshell to which is secured a flexible, sheet material tube and an electrically conductive metallic braid. The braid is located about the tube with both the braid and the tube being secured to the backshell through the use of a metallic band which is shrunk concentrically through the technique of magnetic pulse forming which thereby makes a positive secure connection between the backshell, the braid and the tube. A rubber sleeve is located about the braid which is also secured to the backshell through the technique of magnetic pulse forming which shrinks a second metallic band. The second metallic band overlaps the first metallic band.

7 Claims, 1 Drawing Sheet

FLEXIBLE ELECTROMAGNETIC PULSE SHIELDING CONDUIT

BACKGROUND OF THE INVENTION

The field of this invention relates to an improved form of a flexible electromagnetic pulse shielding conduit for electrical conductors, and more particularly an improved form of conduit over that which is described within U.S. Pat. No. 4,693,323, entitled "Flexible Electromagnetic Pulse Shielding Conduit", issued Sept. 15, 1987, by one of the present inventors.

In the past, it has been common to encase electrical conductors that extend from one location to another. The use of elongated electrical conductors is required for operating electrical equipment remote from the source of the electrical generating signal apparatus. A typical location where a substantial number of electrical conductors are utilized to operate remote equipment would be within an aircraft.

In the past, it has been common to principally shield the electrical conductors from moisture. When dealing with military equipment, and particularly when dealing with electrical conductors that operate critical electrical components, it also has been necessary to protect the conductors from exterior electrical disturbances. Common forms of exterior electrical disturbances are electromagnetic interference and radio frequency interference. It has been common in the past to construct shielding conduits to protect these electrical conductors from such types of interferences.

However, there is another type of interference from which electrical conductors are susceptible and that is termed "electromagnetic pulse". An electromagnetic pulse comes from sources such as a nuclear detonation. It has been found that even the detonation of a relatively small sized nuclear weapon, that is strategically placed within the atmosphere, can cause extensive amount of damage to electronic equipment over a wide geographical area. This damage manifests itself in two ways. One way is hardware damage, usually in the form of semiconductor burnout. The other way is electronic upset, usually in the form of a data transmission loss or loss of stored data.

An electrical conductor may be shielded against electromagnetic and radio frequency interference but not be shielded against electromagnetic pulse. This pulse, when picked up by the electrical conductor, is conducted into the electronic equipment. Any small aperture within a shielded electronic conductor conduit would provide for access of the pulse to the electrical conductor.

In the past, in order to prevent this superimposing of signals onto an electrical conductor, it has been common to encase the electrical conductor within a conduit formed by layers of braided metallic wires. In the constructing of such conduits, it has been common to use clamps and other similar types of mechanical fastening devices in order to secure the ends of these layers of braided wires to the electrical connector fitting (such as a backshell). However it has been found that, over a period of time during installation of these conduits, these mechanical connections become loosened resulting in the forming of small openings within the conduit. Any small opening within any conduit would make such conduit ineffective against protection of electromagnetic pulse. A single unprotected conduit within a bomber or fighter aircraft that is exposed, evenly minorly, to a nuclear explosion will most likely result in that aircraft becoming immediately inoperative.

At times, the length of such conduits may be quite small, no more than a few inches. A shielding conduit requires at each end some form of a fitting commonly referred to as a backshell. In the past, such a backshell in and of itself has been two to three inches in length. It is desirable to construct a backshell to be of the shortest possible length so that such shielding conduits can be constructed to be utilized to be short lengths as well as long lengths.

One type of method of connection between parts is called magnetic pulse forming. Magnetic pulse forming machines were first introduced in 1962. Since that time, magnetic pulse forming machines have been utilized to assemble a variety of manufactured articles which would be difficult and costly to assemble by conventional methods. Magnetic pulse forming is an assembly technique which utilizes a high intensity magnetic field to expand or contract metallic workpieces. Magnetic pulse forming is based on a rapidly changing magnetic field and the current induced in the electrically conductive workpiece. Magnetic pulse forming is capable of compressing or expanding metal members without direct physical contact and without lubricants or torque normally encountered in rolling and spinning operations.

A high flux density is necessary to perform such magnetic pulse forming. This flux density can be produced by discharging a capacitor through a coil for a period of a few microseconds. Thus, tremendous flux densities are produced for a short period of time. It is the magnetic force which moves the metal. In the case of a ring or band and this magnetic pulse being applied exteriorly thereof, this ring or band will in essence shrink and enclose a smaller area. This enclosing technique can be utilized to achieve an extremely strong, secure connection of different parts of a manufactured product.

SUMMARY OF THE INVENTION

A flexible electromagnetic pulse shielding conduit for electrical conductors which is constructed of a backshell to which is securely connected an end of an elongated flexible tube. The exterior wall of the backshell is tapered in the area of connection with the tube. This exterior wall of the backshell also defines a plurality of spaced apart annular grooves. An electrically conductive metallic braid is to be located about the tube with the end of the braid coming directly into contact with an enlarged annular ridge of the backshell. Located about the braid and the tube and the annular ridge is a first metallic band which is to be shrunk through the use of magnetic pulse forming thereby forming a tight secure connection between the backshell, the tube and the braid. Concentrically disposed about the braid is a rubber sleeve with this rubber sleeve also being fixedly secured to the backshell through the use of magnetic pulse forming. The first metallic band has an exterior surface which is hiatused, i.e., includes a series of serrations, to facilitate connection between the band and the rubber sleeve.

The primary objective of the present invention is to construct an electromagnetic shielding conduit which achieves extremely satisfactory secure connection between the backshells and the flexible portion of the conduit located between the backshells wherein each backshell is of a length substantially shorter than was heretofore possible.

DETAILED DESCRIPTION OF THE SHOWN EMBODIMENT

Figure 1:
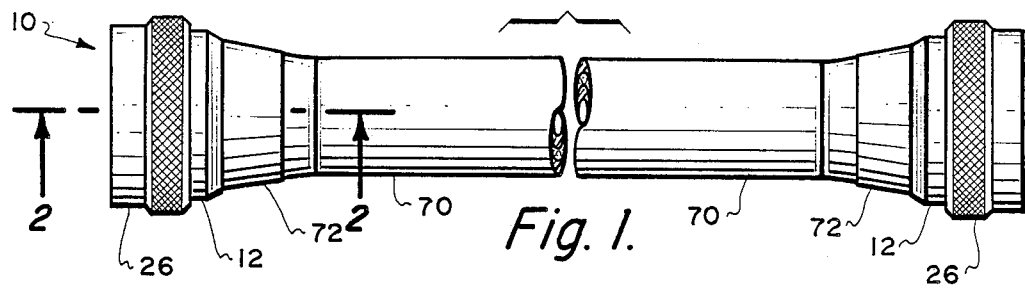
FIG. 1 is an exterior view showing a typical conduit constructed in accordance of this invention showing the conduit broken between the ends thereof.

Referring particularly to the drawing, there is shown the conduit 10 of this invention which can be constructed to be of any desired length. Conduit 10 can be custom designed or can be constructed in different "off the shelf" lengths. Conduit 10 will terminate at each end with a fitting which is commonly referred to as a backshell 12.

The backshell 12 is formed of a metallic member having an internal chamber 14. The internal chamber 14 terminates in an open inner end 16 and an open outer end 18. Formed within the exterior surface of the backshell 12 in the area of the outer end 18 is a groove 20. Within the groove 20 is located a ring 22. This ring 22 is mounted within an annular groove 24 of a connecting sleeve 26. The outer end of the connecting sleeve 26 is interiorly threaded at 28. Between the threads 28 and the backshell 12 is an O-ring sealing member 30. The threads 28 are to connect with an appropriate connection of an electronic device (not shown) and tightened to form a positive, totally enclosing, secure connection therebetween.

The exterior surface of the inner end 16 of the backshell 12 includes a plurality of spaced apart annular grooves 32, 34 and 36. Between the groove 32 and the inner end 16 of the backshell 12 is located an enlarged annular ridge 38. Between the groove 32 and the groove 34 is located an annular ridge 40. Located between the groove 34 and the groove 36 is also located a similar annular ridge 42. Forming the outer wall of the groove 36 is a still further annular ridge 44.

It is to be noted that the diameter of the ridge 44 is slightly greater than the diameter of the ridge 42. Similarly, the diameter of ridge 42 is slightly greater than the diameter of the ridge 40. Also, the diameter of the ridge 40 is slightly greater than the diameter of enlarged ridge 38. This portion of the exterior wall surface of the backshell 12 is tapered with a preferable amount of taper being approximately two degrees. However, it is to be considered within the scope of this invention that this amount of taper can be decreased or increased. It is to be understood that within the drawing this tapering has been substantially exaggerated for illustrative purposes.

Next to the outer surface of the ridge 44 is an annular depression 46. The outer wall of the depression 46 is formed by enlarged annular ridge 48. Backwall of annular ridge 48 connects to a still further annular depression 50. It is to be noted that the exterior surface of the ridge 48 is shown tapered. However, it may be desirable to have the exterior surface of ridge 48 essentially cylindrical and not tapered. Also, the exterior surface of ridge 48 is hiatused; that is, it includes a series of serrations 52.

Figure 2:
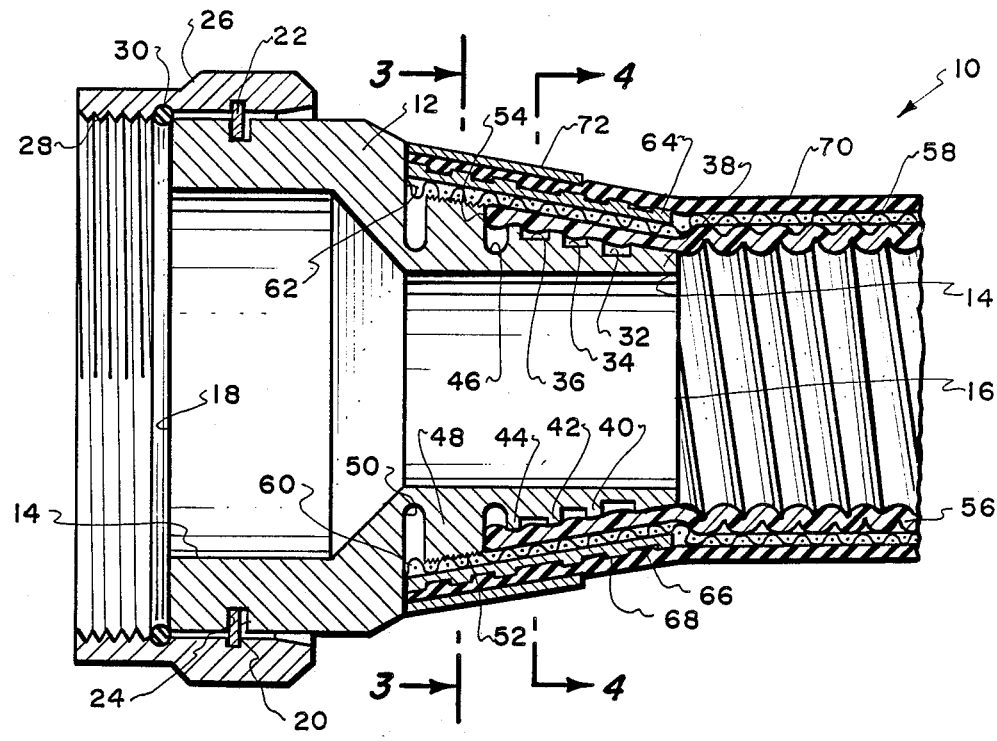
FIG. 2 is a longitudinal cross-sectional view of the conduit of this invention taken along line 2—2 of FIG. 1 showing in detail the attachments to the backshell by the use of the magnetic pulse forming technique.
Figure 3:
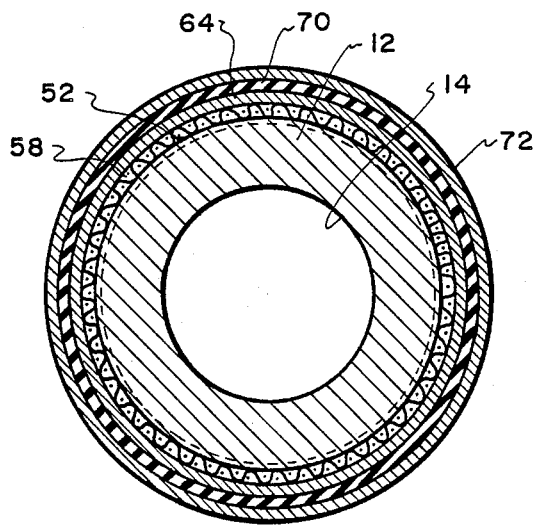
FIG. 3 is a transverse cross-sectional view through the conduit of this invention taken along line 3—3 of FIG. 2.
Figure 4:
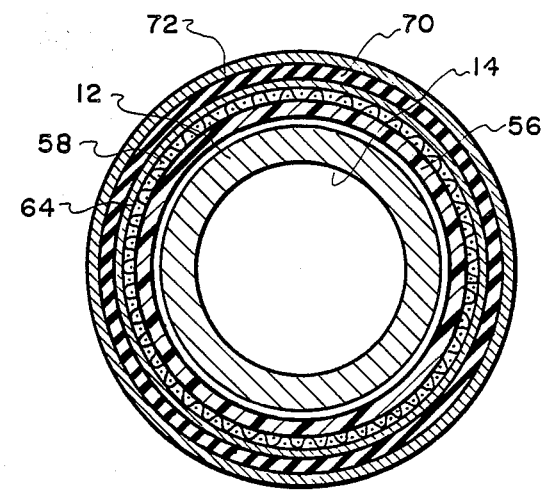
FIG. 4 is a transverse cross-sectional view through the conduit of this invention taken along line 4—4 of FIG. 2.

An open 54 of a sheet material, plastic tube 56 is to be placed over the exterior surface of the inner end 16 so that the inner wall surface of the tube 56 snugly rests against ridges 38, 40, 42 and 44 with the end 54 abutting against enlarged annular ridge 48. The internal diameter of the tube 56 is to be equal to the diameter of the inner end 16. In order to permit insertion of the tube 56 onto the tapered configuration of ridges 38, 40, 42 and 44, the end of the tube 56 will be initially flared or expanded prior to being inserted into the position shown in FIG. 2 of the drawing.

It is important that the tube 56 be flexible so that the tube 56 can make sharp bends in order to be located around fixed structures such as one might find within confined areas of an aircraft. The tube 56 functions not only as a moisture barrier for the electrical conductors located therewithin, but also the tube 56 can function to retain a gas such as nitrogen if such is deemed to be desirable. A preferable form of the tube 56 would be a convoluted tube. However, it is considered to be within the scope of this invention that any tube of any configuration could be utilized as long as the tube was sufficiently flexible. It happens to be that a convoluted tube permits the desired flexibility.

In order to prevent electromagnetic radiation from penetrating the tube 56, it is normally desired to encase the tube 56 with the metallic tubular braid 58. The end 60 of the braiding 58 is also flared so that it can be located over tube 56 and across the exterior surface of the serrated surface 52 of the annular ridge 48 and come to rest against wall surface 62 of the backshell 12. The wall surface 62 forms the back wall surface of the depression 50. This braiding is to be tightly woven forming a tightly intertwined tubular member. Typical material of construction of the braiding 58 would be tin, copper or a PHOSPHOR BRONZE. Also, it is considered to be within the scope of this invention that more than one layer of braiding 58 could be utilized. It is also considered to be within the scope of this invention that in certain installations the braiding 58 may not be utilized.

A metallic band 64 is then located about the braid 58 with the outer end of the band 64 also abutting against the wall 62. This band 64 will normally be constructed of aluminum or some other metal which is shrinkable when placed within a high intensity magnetic field of a magnetic pulse forming machine (not shown). When subjected to this force, the band 64 is shrunk tightly onto the backshell 12 tightly binding the braiding 58 and the tube 56 to the backshell 12. As a result, an extremely strong, secure connection is obtained.

The exterior surface of the band 64 is also hiatused forming a plurality of spaced-apart annular recesses 66 which are separated by annular ridges 68. Located about the band 64 is a protective upper sleeve 70. It is the function of the sleeve 70 to prevent moisture from coming into contact with the braiding 58. The end of the sleeve 70 also abuts against the wall surface 62. This sleeve 70 is to be fixedly secured onto band 64 through the use of a shrinkable band 72. This band 72 also abuts against the wall surface 62. When the band 72 is shrunk, portions of the rubber of the sleeve 70 are depressed within the annular recesses 66 which facilitate a tight connection therebetween. The function of the sleeve 70 is not only to protect the braiding 58 from moisture as well as other contamination, but also to provide a comfortable exterior surface so that the conduit 10 of this invention can be readily grasped by an individual and handled comfortably during installation. The band 72 overlaps the band 64 thereby achieving constructing of a shorter length backshell 12 than would be possible with prior art backshells such as is shown and disclosed within the aforementioned U.S. Pat. No. 4,693,323.

There may be included within the conduit 10 a static grounding wire (not shown) to also eliminate any contamination of the conduit 10 by static electricity.

What is claimed is:

1. A flexible electromagnetic pulse shielding conduit for electrical conductors comprising:
   a backshell having an internal open-ended chamber, said backshell having an inner end and an outer end, said outer end being adapted to connect with a separate electrical apparatus;
   a sheet material tube, said tube being flexible, said tube having an open end, said tube having an interior chamber, said inner end extending through said open end within said interior chamber with said tube being snugly mounted on said inner end;
   a first metallic band located about said tube at said inner end, said first metallic band being shrunk about said inner end thereby tightly binding said tube to said backshell forming a secure connection therebetween;
   a rubber sleeve disposed about said tube and said inner end, a second metallic band located about said rubber sleeve, said second metallic band being shrunk about said rubber sleeve thereby tightly binding said rubber sleeve to said backshell forming a secure, mositure-proof seal therebetween, said second metallic band concentrically overlapping said first metallic band;
   an electrically conductive tubular member concentrically disposed about said tube, said electrically conductive tubular member being securely fixed in place between said first metallilc band and said tube;
   said electrically conductive tubular member comprising a sleeve of braided material; and
   said inner end defining a raised annular ridge, said raised annular ridge having a serrated exterior surface, said sleeve of braided material directly abutting against said serrated exterior surface of said raised annular ridge.

2. The electromagnetic pulse shielding conduit as defined in claim 1 wherein:
   said first metallic band has a hiatused exterior surface, said rubber sleeve tightly binding onto said hiatused exterior surface.

3. The flexible electromagnetic pulse shielding conduit as defined in claim 2 wherein:
   the exterior wall surface of said inner end comprises a series of annular spaced apart ridges forming a plurality of spaced apart annular grooves, each said annular groove providing a space for said tube to deform therewith.

4. The flexible electromagnetic pulse shielding conduit as defined in claim 3 wherein:
   the exterior wall surface of said inner end of said backshell is tapered so that the portion of said inner end located directly adjacent to said outer end is of the greatest diameter.

5. A flexible electromagnetic pulse shielding conduit for electrical conductors comprising:
   a backshell having an internal open-ended chamber, said backshell having an inner end and an outer end, said outer end being adapted to connect with a separate electrical apparatus;
   a sheet material tube, said tube being flexible, said tube having an open end, said tube having an interior chamber, said inner end extending through said open end within said interior chamber with said tube being snugly mounted on said inner end;
   a first metallic band located about said tube at said inner end, said first metallic band being shrunk about said inner end thereby tightly binding said tube to said backshell forming a secure connection therebetween; and
   a rubber sleeve disposed about said tube and said inner end, a second metallic band located about said rubber sleeve, said second metallic band being shrunk about said rubber sleeve thereby tightly binding said rubber sleeve to said backshell forming a secure, moisture-proof seal therebetween, said second metallic band concentrically overlapping said first metallic band;
   an electrically conductive tubular member concentrically disposed about said tube, said electrically conductive tubular member being securely fixed in place between said first metallic band and said tube; and
   said inner end defining a raised annular ridge, said raised annular ridge having a serrated exterior surface, said electrically conductive tubular member directly abutting against said serrated exterior surface of said raised annular ridge.

6. The flexible electromagnetic pulse shielding conduit as defined in claim 5 wherein:
   said first metallic band has a hiatused exterior surface, said rubber sleeve tightly binding onto said hiatused exterior surface.

7. The flexible electromagnetic pulse shielding conduit as defined in claim 5 wherein:
   the exterior wall surface of said inner end comprises a series of annular spaced apart ridges forming a plurality of spaced apart annular grooves, each said annular groove providing a space for said tube to deform therewithin.

* * * * *